US006653639B1

United States Patent
Novak

(10) Patent No.: US 6,653,639 B1
(45) Date of Patent: Nov. 25, 2003

(54) CHUCK FOR MOUNTING RETICLE TO A RETICLE STAGE

(75) Inventor: W. Thomas Novak, Hillsborough, CA (US)

(73) Assignee: Nikon Corporation (JP)

( * ) Notice: Subject to any disclaimer, the term of this patent is extended or adjusted under 35 U.S.C. 154(b) by 53 days.

(21) Appl. No.: 09/691,303

(22) Filed: Oct. 17, 2000

(51) Int. Cl.[7] .............................. G01J 1/00; G01N 21/00; H01J 37/20

(52) U.S. Cl. ................................. 250/491.1; 250/492.2; 250/442.11

(58) Field of Search ........................ 250/442.11, 491.1, 250/492.2

(56) References Cited

U.S. PATENT DOCUMENTS

| 4,185,202 A | | 1/1980 | Dean et al. | |
|---|---|---|---|---|
| 4,326,805 A | | 4/1982 | Feldman et al. | |
| 4,444,492 A | * | 4/1984 | Lee | 355/55 |
| 4,514,858 A | | 4/1985 | Novak | |
| 4,516,253 A | | 5/1985 | Novak | |
| 4,544,311 A | | 10/1985 | Husain | |
| 4,549,843 A | | 10/1985 | Jagusch et al. | |
| 4,694,477 A | * | 9/1987 | Siddall | 378/34 |
| 5,536,559 A | * | 7/1996 | Cerrina et al. | 428/192 |
| 5,644,137 A | * | 7/1997 | Waggener et al. | 250/492.2 |
| 5,806,193 A | * | 9/1998 | Ebihara | 33/1 M |
| 6,239,924 B1 | * | 5/2001 | Watson et al. | 359/819 |

FOREIGN PATENT DOCUMENTS

| EP | 0 121 969 | 10/1984 |
|---|---|---|
| EP | 0 182 443 | 5/1986 |

OTHER PUBLICATIONS

Fay et al., "Advanced x-ray alignment system", (1986), SPIE vol. 632 Electron–Beam, X–Ray, & Ion–Beam Techniques for Submicrometer Lithographies V, pp. 146–155.
Fay et al., "Automatic X-Ray Alignment/Exposure System for VLSI Process Development", (1983), Microcircuit Engineering 83, pp. 269–278.
Novak, "Recollection of Bell Labs Mask Holding Mechanism", Apr. 4, 2003.

* cited by examiner

Primary Examiner—Bruce Anderson
(74) Attorney, Agent, or Firm—Beyer Weaver & Thomas LLP

(57) ABSTRACT

A lithography system for processing a substrate is disclosed. The lithography system includes a stage for moving the substrate relative to a beam. The lithography system further includes a chuck for securely holding the substrate during stage movement. The lithography system additionally includes a support assembly for holding the chuck in a fixed position relative to the stage while accommodating for deformations in either the chuck or the stage during processing so as to precisely locate the substrate relative to the stage and to reduce external stresses that cause substrate distortions.

35 Claims, 3 Drawing Sheets

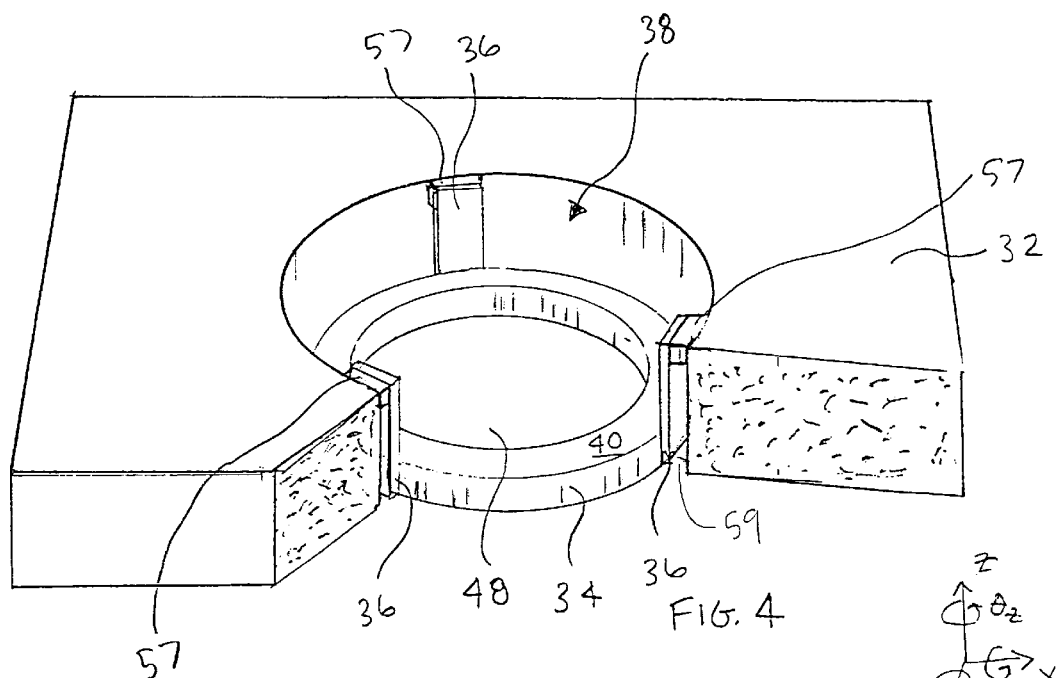
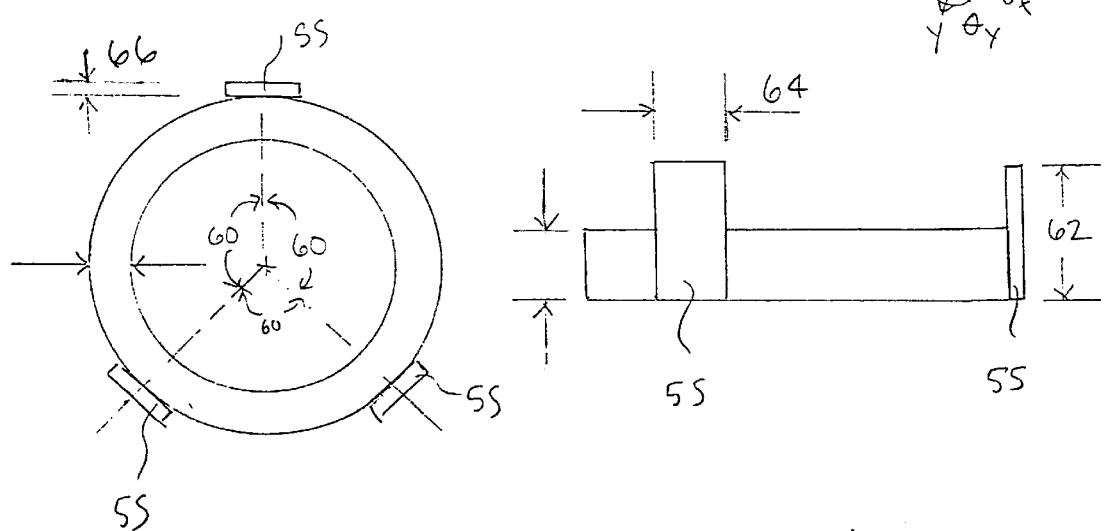
FIG. 4
FIG. 5
FIG. 6

CHUCK FOR MOUNTING RETICLE TO A RETICLE STAGE

BACKGROUND OF THE INVENTION

The present invention relates generally to a lithography system. More particularly, the present invention relates to improved techniques for supporting and holding a reticle.

Lithography systems used in the manufacture of integrated circuits and related devices have been around for some time. Such systems have proven extremely effective in the precise manufacturing and formation of very small details in the product. In most lithography systems, a circuit image is written on a wafer by projecting a beam through a patterned reticle. By way of example, optical lithography systems and electron beam projection systems, which tend to produce finer geometries than optical lithography systems, have been widely used to reproduce a circuit image on a silicon wafer. In optical lithography systems, a beam of light is used to scan the surface of the reticle. In electron beam projection lithography systems, a beam of electrons is used to scan the surface of the reticle.

Electron beam projection lithography systems typically include an illuminator for directing electron beams of finite area through patterns resident on the surface of a reticle, a stage for moving the reticle relative to the beam, a chuck for supporting the reticle relative to the stage, and a projector for projecting the transmitted electron beam (e.g., the pattern of electrons passing through the reticle) onto the surface of a wafer. In order to process the wafer, the stage is moved along a linear scan path while the electron beams are swept orthogonally to the linear path so that all or any selected part of the patterned reticle is scanned. Although only a small portion of the reticle is imaged at any one time, the surface of the reticle is sequentially exposed to electron beams, allowing a pattern to be built up on the wafer.

In general, the beam sweep is in a direction parallel to the Y-axis as viewed at the reticle, and the linear scan path is in a direction parallel to the X-axis as viewed at the reticle. More particularly, as the beams are swept, the stage carrying the reticle is typically moved back and forth in the X direction while being incremented in the Y-direction at the end of each traversal so that the beam sweeps along a substantially serpentine path across a predetermined area of the reticle. The predetermined area may correspond to a single identified sub area, a plurality of identified sub areas or the entire reticle. Furthermore, the chuck is required to hold the reticle in place while the stage is moved. In most cases, a large clamping force is needed to overcome the forces generated by the high acceleration (e.g., 4 g) associated with the stage. If the holding force is not sufficient, then the reticle may peel away or shift from the chuck during high accelerations.

Electron beam projection lithography systems generally require precise tolerances in order to achieve finer geometries. For example, because an electron beam projection lithography system generally determines reticle position relative to the stage position, the system must be capable of precisely locating the reticle relative to the stage. In general, the reticle must effectively not be allowed to change position with respect to the stage. As should be appreciated, reticle misalignment tends to cause errors in projecting the reticle pattern onto the wafer surface, especially with the extreme level of accuracy that is sought in electron beam projection lithography.

Unfortunately, reticle misalignment can be encountered when external stresses are induced on the reticle or other related structures such as the chuck or stage. Such stresses may be caused by mechanical distortion of the reticle or chuck to which the reticle is mounted, or by differential thermal expansion or contraction between the reticle and the chuck. With regards to differential thermal expansion or contraction, stresses may be transmitted to the reticle when the reticle expands or contracts while the chuck remains static or when the chuck expands or contracts while the reticle remains static. In most cases, a high intensity electron beam tends to raise the temperature of the reticle during processing thus making the reticle expand. By way of example, the reticle may bow if the chuck tries to keep its original dimension while the reticle is trying to expand. Alternatively, if the stress is too high then the reticle may slip from its original position. This change in height or position may adversely affect the projected pattern. Moreover, even if the chuck complied to the expansion and contraction of the reticle, stresses may be transmitted to the reticle and/or chuck when the reticle expands or contracts and the supporting structure remains static.

Furthermore, the throughput associated with electron beam projection systems has generally been limited, due at least in part to the fact that electron beam systems operate in a vacuum. Also, within electron beam projection systems, the implementation of a step and scan configuration may be difficult. Specifically, implementing a step and scan configuration with respect to a stage which scans reticles, e.g., a reticle stage, is difficult, as electron beam projection systems have specific requirements which are not requirements for typical optical lithography systems. By way of example, an electron beam projection system generally must operate in a high vacuum environment. Further, an electron beam projection system may not include moving magnets, as moving magnets cause the magnetic field associated with the electron beam projection system to change. An electron beam projection system also may not having moving iron structures, due to the fact that moving iron dynamically alters the static magnetic fields around an electron beam lens. Finally, an electron beam projection system may not have metal parts which move such that eddy currents are generated in static magnetic fields with concomitant additional varying magnetic fields.

Therefore, what is needed is a method and an apparatus for enabling reticles to be precisely and stably held within an electron beam projection lithography system.

SUMMARY OF THE INVENTION

The invention relates, in one embodiment, to a lithography system for processing a substrate. The lithography system includes a stage for moving the substrate relative to a beam. The lithography system further includes a chuck for securely holding the substrate during stage movement. The lithography system additionally includes a support assembly for holding the chuck in a fixed position relative to the stage while accommodating for deformations in either the chuck or the stage during processing.

The invention relates, in another embodiment, to a support assembly for holding a chuck in a fixed position relative to a stage while allowing some plasticity of the chuck during processing. The support assembly includes a plurality of flexures, each of which has one end attached to the stage and an opposite end attached to the chuck. Additionally, the plurality of flexures work together to restrain the chuck from lateral, vertical and rotational movements while allowing some expansion or contraction of the chuck relative to the stage.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4 illustrates a perspective view of the stage shown in FIG. 3, in accordance with one embodiment of the present invention.

FIG. 5 shows a top view of a kinematic support assembly, in accordance with one embodiment of the present invention.

FIG. 6 shows a side view of a kinematic support assembly, in accordance with one embodiment of the present invention.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

The invention generally pertains to an electron beam projection lithography system. More particularly, the invention pertains to an improved method and apparatus for mounting a reticle to a reticle stage. One aspect of the invention relates to precisely locating the reticle relative to the reticle stage. Another aspect of the invention relates to reducing external stresses that typically cause reticle distortion.

In accordance with one embodiment of the present invention, there is provided a lithography system that includes a stage, a chuck and a kinematic support assembly. The stage is configured to move the reticle relative to a beam such as for example an electron beam, and the chuck is configured to securely hold the reticle during stage movement to prevent reticle shifts. In one implementation, the chuck is arranged to be pliable so as to reduce stresses caused by a constrained and deforming reticle, i.e., a thermally expanding or contracting reticle. Furthermore, the kinematic support assembly is configured to hold the chuck in a fixed position relative to the stage, while permitting some plasticity of the chuck during processing so as to reduce stresses caused by a constrained and deforming chuck, i.e., a thermally expanding or contracting chuck.

Embodiments of the invention are discussed below with reference to FIGS. 1–6. However, those skilled in the art will readily appreciate that the detailed description given herein with respect to these figures is for explanatory purposes as the invention extends beyond these limited embodiments.

Figure 1:
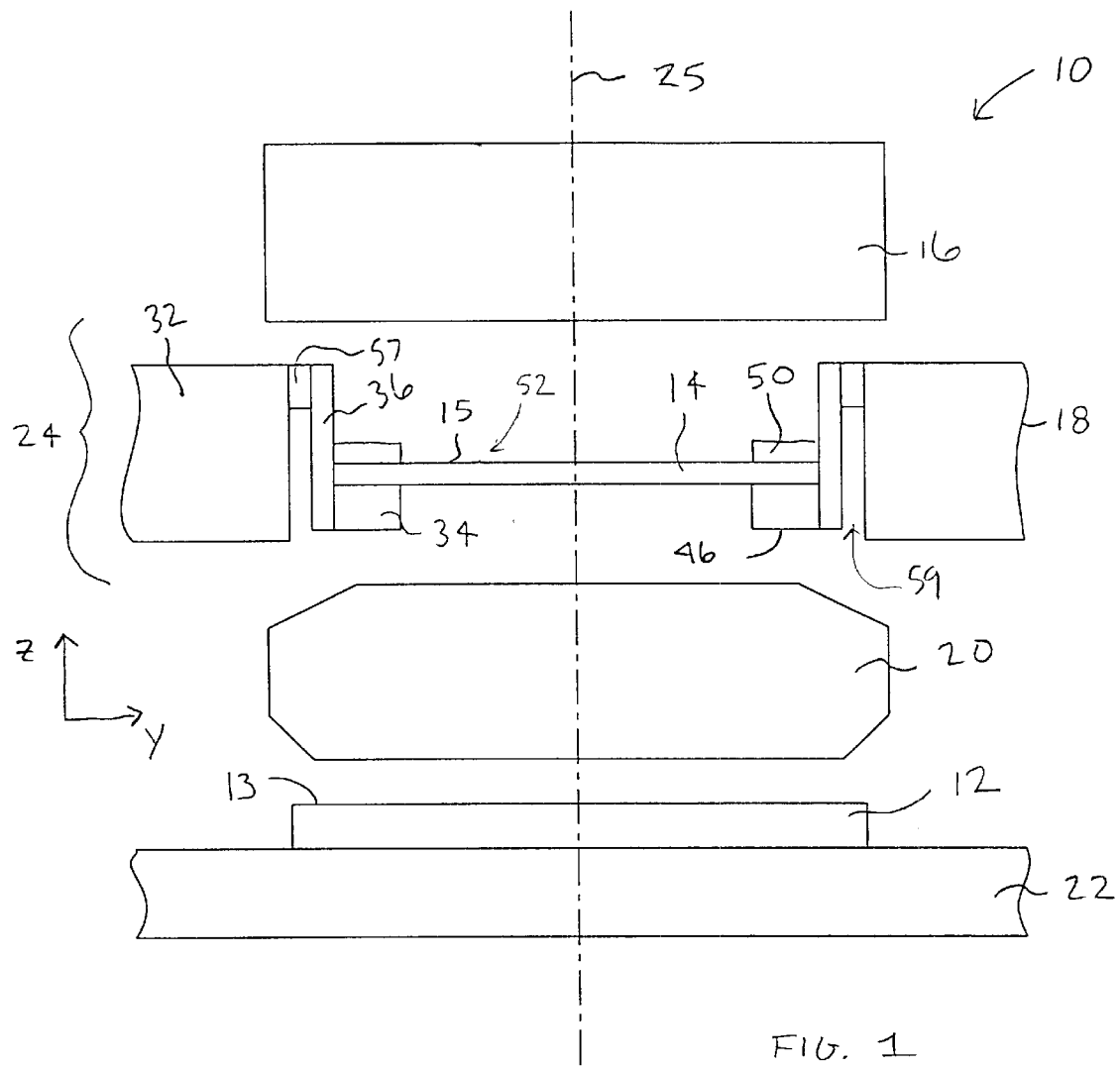
FIG. 1 illustrates a simplified diagram of an electron beam projection lithography system, in accordance with one embodiment of the present invention.

FIG. 1 is a simplified diagram of an electron beam projection lithography system 10, in accordance with one embodiment of the present invention. The lithography system 10 is arranged for writing a circuit image on the surface of a wafer 12 by projecting a beam through a patterned reticle 14. The dimensions of various components are exaggerated to better illustrate the components of this embodiment. As shown, the lithography system 10 includes an illuminator 16, a reticle stage 18, a projector 20 and a wafer stage 22. In general, the illuminator 16 both generates an electron beam and directs the electron beam to the surface of the reticle 14, and the projector 20 both collects transmitted electron beams and projects the transmitted electron beam to the surface of the wafer 12. Although not shown, the illuminator 16 typically includes an electron source and an illumination lens assembly that work together to make the electron beam incident on the reticle and to sweep the electron beam in the Y-direction. In addition, the projector 20 typically includes a projection lens assembly for reducing the size of the transmitted electron beam so as to form the electronic circuit of final size onto the wafer 12.

Furthermore, the reticle stage 18 is positioned within a gap 24 defined between the illuminator 16 and the projector 20, and the wafer stage 22 is positioned below the projector 20. Both stages are arranged for moving within a single plane and relative to the axis 25. That is, the stages move in both the x and y directions. The reticle stage 18 is configured to move the reticle 14 so that all or any selected part of the reticle surface 15 is scanned by the electron beam. Although not shown, the reticle stage 18 may be arranged to accommodate multiple reticles, e.g., two or three reticles, which include complementary patterns of an entire chip circuit which is to be formed on the wafer 12. The wafer stage 22, on the other hand, is configured to move the wafer 12 so that the scanned reticle surface 15 is printed on all or any selected part of the wafer surface 13. More particularly, electrons that pass through the reticle 14 during reticle stage 18 movement are projected onto the wafer 12 during wafer stage 22 movement such that a pattern defined by the reticle 14 is formed on the wafer 12. In most cases, the wafer stage 22 moves in an opposite direction relative to the reticle stage 18. In one embodiment, the stages 18 and 22 are arranged to move in a serpentine fashion. For example, the stage scans in one direction, e.g., along the X-axis (into and out of the page), and steps in another direction, e.g., along the Y-axis.

A representative stage used in electron beam projection lithography systems is described in co-pending U.S. patent application Ser. No. 60/226,409 to Watson et al., which is titled, "Cantilever reticle Stage for Electron Beam Projection Lithography System," and which is herein incorporated by reference.

Figure 2:
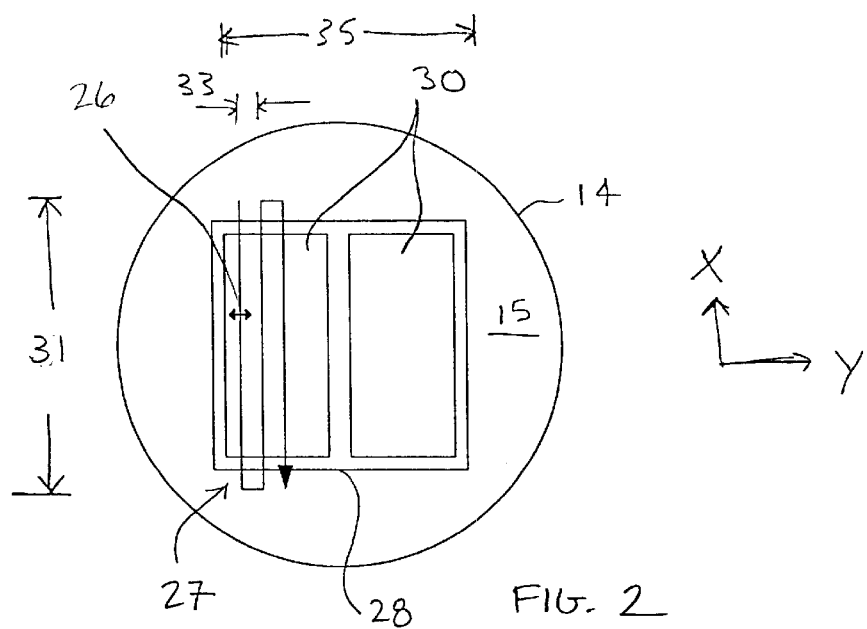
FIG. 2 shows a top view of a reticle during an electron beam scan, in accordance with one embodiment of the present invention.
Figure 3:
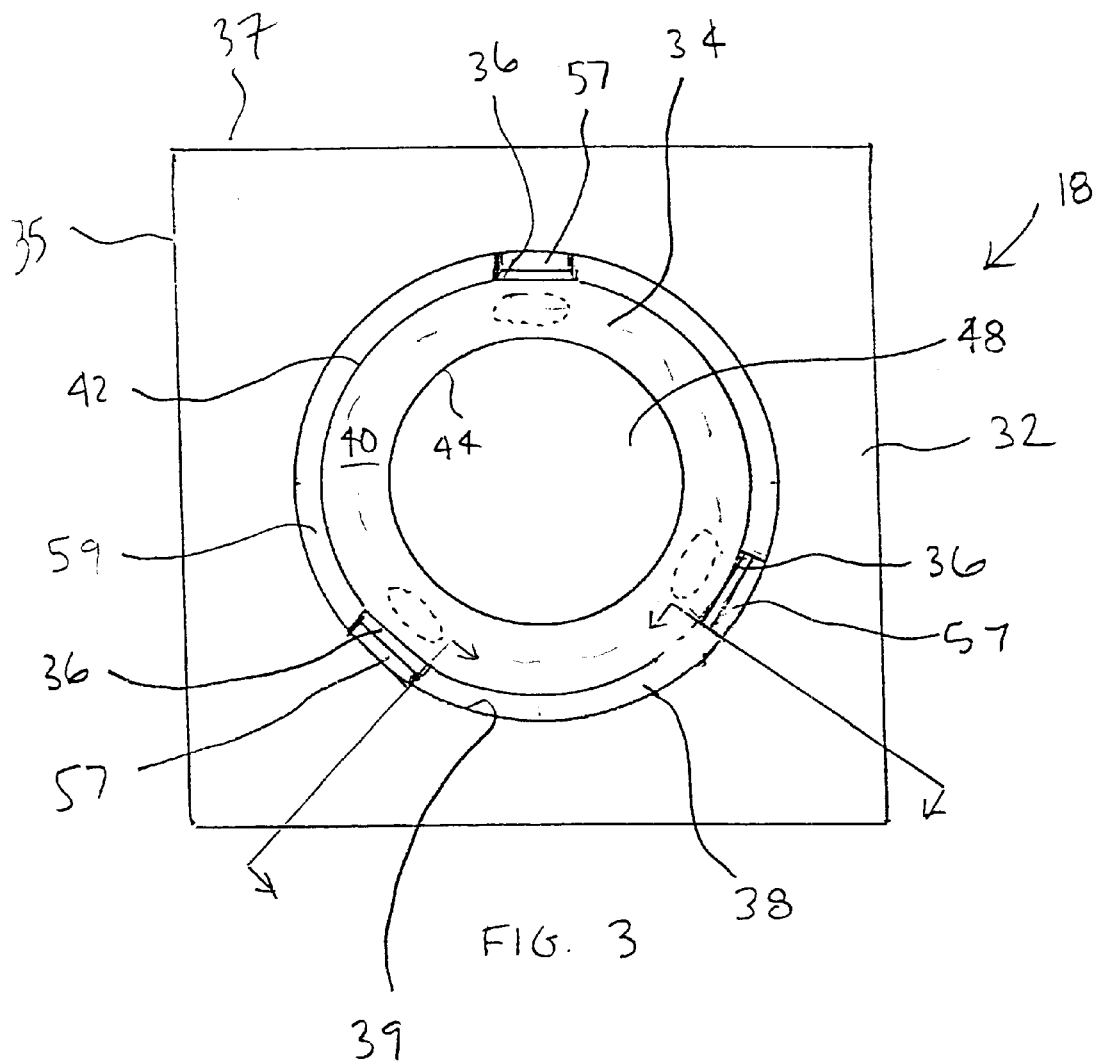
FIG. 3 shows a top view of a stage, in accordance with one embodiment of the present invention.

Referring to FIG. 2, a top view of the reticle 14 is shown during a typical scan. As mentioned, a beam sweep 26 is directed by the illuminator (not shown in FIG. 2) in a direction parallel to the Y-axis as viewed at the reticle surface 15. As the beam is swept, the stage (not shown in FIG. 2) carrying the reticle 14 moves back and forth in the direction of the X-axis while being incremented in the Y-direction at the end of each traverse so that the electron beam is caused to sweep along a substantially serpentine path 27 across a predetermined area 28 of the reticle 14. The predetermined area 28 may correspond to a single identified sub area (e.g., a single stripe), a plurality of identified sub areas (e.g., a plurality of stripes) or the entire reticle 14. In the embodiment shown, the reticle 14 has two scanning stripes 30. Alternatively, it should be noted that beam sweep and stage movements may be reversed such that the beam sweep is directed in an X direction, and the stage moves back and forth in the Y direction while being incremented in the X direction.

In order to scan the predetermined area 28, the X stroke 31 of the reticle stage along the X-axis may be relatively large. By way of example, in some systems, the size of the stroke along the X-axis may be in the range of approximately 400 to 700 mm. On the other hand, each incremental Y stroke 33 of the reticle stage along the Y-axis may be relatively small, while the overall Y stroke 35 of the reticle stage along the Y-axis may be relatively large. By way of example, in some systems, the size of the incremental Y stroke along the Y-axis may be up to about 30 mm, and the overal Y stroke may be up to about 180 mm. It should be appreciated, however, that these sizes are not a limitation, and that the size of the stroke may vary according to the specific needs of each system. The size of the strokes are typically dependent upon the size and the configuration of the reticles. Specifically, each reticle that is supported by the reticle stage may have multiple scanning stripes, thereby effectively requiring that the stroke of the retcile stage be sufficient to cover each of the scanning stripes.

Referring now to FIGS. 1 and 3–6, the reticle stage 18 will be described in greater detail. The reticle stage 18 generally includes a stage table 32, a reticle chuck 34 and a kinematic support flexure 36. As shown, the reticle chuck 34 is structurally coupled to the stage table 32 via the kinematic support assembly 36. By kinematic, it is meant that the support assembly is allowed to move in order to adapt to external forces in a non-hysteretic way. Generally speaking, the stage table 32 provides a moving structure for scanning the reticle 14, the chuck 34 provides a means for securely holding the reticle 14, and the kinematic support assembly 36 provides a means for supporting the chuck 34 in a fixed position relative to the stage table 32, while permitting some plasticity (e.g., expansion or contraction) of the chuck 34 during processing. By allowing some plasticity, stresses induced on the reticle 14 are reduced and the reticle 14 can be precisely located relative to the stage table 32.

With regards to the stage table 32, the stage table 32 may be in the form of a plate or cantilever, which includes an opening 38 that is sized to accommodate the reticle 14 and the reticle chuck 34. Typically, the opening 38 is aligned such that the reticle 14 may be aligned in a scanning direction, i.e., along an X-axis, to enable travel along Y-axis to be substantially minimized. In most cases, the opening 38 is a circular opening. However, it should be noted that this may vary according to the specific needs of each system. For example, the opening may be oriented in a substantially square pattern. Moreover, the reticle table 32 may be formed from substantially any non-metallic material which has acceptable outgassing characteristics for a relatively high vacuum. By way of example, reticle table 32 may be formed as a ceramic structure. The formation of reticle table 32 from ceramic enables reticle table 32 to move within an electron beam projection system without significantly affecting the magnetic fields associated with the electron beam projection system. Although the reticle table 32 is shown with only one opening 38, the table may generally include any number of openings, as for example two openings. The number of openings may be determined, for instance, on the size of the pattern area and the number of patterns needed to fit a chip on a wafer.

In general, at least one or two sides and a front edge of the reticle table may include mirrored surfaces, i.e., reticle stage mirrors. By way of example, a first mirror may be positioned on a first side 35 of the table 32 and a second mirror may be positioned on a second side 37 of the table 32. As shown, the second side 37 is orthogonal to the first side 35. It should be noted that this is not a limitation and that the position of the mirrors may vary according to the specific design of each system. The mirrored surfaces enable laser interferometer beams to be substantially reflected off of the sides and front edge to enable positioning measurements to be made with respect to the reticle table. For example, the front edge may be used to facilitate the measurement of a linear position of stage in x-direction as well as measurements of a rotational position of stage about y-axis and z-axis, i.e., an angle θy and an angle θz, respectively. Similarly, the sides may be used to measure a linear position of stage along y-axis, and rotational positions about z-axis, i.e., an angle θz, and x-axis, i.e., angle θx.

With regards to the reticle chuck 34, the reticle chuck 34 is configured to support and hold the reticle 14 during processing. More particularly, the chuck 34 is required to hold the reticle 14 in place while the stage 18 is moved such that the position of the reticle 14 is known throughout processing. That is, if the chuck position is known, then the reticle position should be known as well. In general, a large clamping force is needed to overcome the forces generated by the stage's high acceleration (e.g., up to approximately 4 g). If the holding force is not sufficient then the reticle 14 may peel away or shift from the chuck 34 during high accelerations. It should be appreciated, however, that too high of a clamping force may cause mechanical distortion of the reticle 14. Both reticle shifts and mechanical distortion may adversely effect the transferred reticle pattern.

The chuck 34 generally includes a top surface 40, an outer peripheral surface 42, an inner peripheral surface 44 and a bottom surface 46. The top surface 40 provides a surface where the reticle 14 rests and the inner peripheral surface 44 defines an opening 48 which is sized to accommodate the pattern (or predetermined area in FIG. 2) disposed on the reticle 14. That is, the opening 48 is sized to permit the transmitted electron beam to pass therethrough. In most embodiments, the reticle chuck 34 is an annular ring having a circular opening 48. However, it should be noted that this may vary according to the specific needs of each system. For example, the opening (or the outer periphery) may be oriented in a substantially square or rectangular pattern. As should be appreciated, the reticle pattern is typically formed as a square or rectangle. Furthermore, the outer periphery of the chuck 34 generally coincides with outer periphery of the reticle 14 such that the top surface of the chuck 34 is fully covered by the reticle 14 when the reticle is disposed on the chuck 34 for processing. In an alternate embodiment, the outer periphery of the chuck 34 may extend past the outer periphery of the reticle 14.

In one embodiment, the reticle chuck 34 represents an ESC (electrostatic) chuck, which secures the reticle 14 to the chuck's surface by electrostatic force. In one implementation, the top surface 40 is enlarged, at least in part, to provide a greater surface area for clamping. By way of example, the opening 48 may be made to match the minimum required space for projecting a beam through the reticle so as to increase the area of the top surface 40. It is generally believed that the greater the area, the greater the holding force. By increasing the holding force, the stage can move faster (without reticle shifts) thus increasing productivity. In addition, because of the enlarged surface area there is less clamping distortion. Although an ESC chuck is described, it should be noted that this is not a limitation and that other forms of providing a clamping force may be used. For example, a mechanical chuck may also be used to secure the reticle to the chuck's surface. Electrostatic chucks may be preferred over mechanical clamping methods because mechanical clamping methods are generally more complex and may cause reticle distortion. Furthermore, if the chuck is used in a system other than electron beam projection lithography systems (processes wafers in a vacuum chamber) then a vacuum chuck may be used.

In general, the reticle is preferably maintained at a constant and uniform temperature. The electron beam, however, tends to heat the reticle to some extent, which means there is some thermal expansion and contraction taking place. As mentioned, stresses may transmitted to the reticle when the reticle thermally expands or contracts and the chuck remains static. For instance, the reticle may bow if the chuck tries to keep its original dimension during reticle expansion or contraction or if the stress is to high then the reticle may slip from its held position during reticle expansion or contraction. Both bowing and slippage may lead to circuit transfer problems. For example, bowing increases or decreases the height of certain portions on the reticle and therefore the projected pattern may be distorted. In addition, reticle slippage often changes the position of the reticle and thus the projected pattern may be misaligned. Moreover, it would be difficult for the system to determine where the reticle is relative to the moving stage.

Therefore, in accordance with one aspect of the invention, the chuck is arranged to be pliable so as to reduce stresses caused by a constrained and deforming reticle, i.e., a thermally expanding or contracting reticle. In one embodiment, the chuck 34 is configured to expand and retract at substantially the same rate as the reticle such that the reticle and the chuck expand and retract together. That is, the chuck is configured to go through essentially the same thermal distortion as the reticle. This can be accomplished in a variety of ways. In one implementation, for example, the chuck can be formed from a material that has a similar coefficient of thermal expansion as the reticle. In another implementation, the chuck can be formed from a material that is similar to the reticle. In most cases, the reticle is formed from silicon and therefore, in one embodiment the chuck is also formed from silicon. It should be noted, however, that the chuck could also be formed from a ceramic having the same coefficient of thermal expansion as the silicon reticle. Furthermore, in cases, where the reticle is formed from another material, the chuck could also be formed from this material, or from a material with a similar coefficient of thermal expansion. As should be appreciated, by allowing the chuck to expand and contract with the reticle, stresses induced between the reticle and the chuck are generally reduced. As such, reticle distortions, i.e., bowing and/or reticle misalignment such as slips, can be substantially prevented.

Even if the chuck and reticle are formed from the same material, or from materials with substantially similar coefficients of thermal expansion, they may still expand or retract at different rates. By way of example, thermal contact between the adjacent surfaces of the chuck and reticle may be poor due to the fact that they contact at discrete points (e.g., local points of contact). Poor thermal contact typically leads to poor heat transfer and therefore there may be a temperature difference between the reticle and the chuck. This temperature difference may cause the reticle and chuck to expand at different rates. By way of example, the reticle and chuck may have a temperature differential of between about 1 to about 3 degrees ° C.

Therefore, in accordance with another aspect of the invention, the dimensions of the chuck are arranged to reduce stress induced distortions of the reticle. By way of example, the reticle/chuck interface may not be planar and therefore when the reticle is secured to the chuck (e.g., electrostatic clamping), the reticle may distort to overcome the non planar interface. The non-planar interface may be due to a non planar chuck or reticle or particle(s) located between the chuck and reticle. In one embodiment, the chuck is made relatively thin (as compared to prior art chucks) to overcome these type of distortions. By making the chuck thin, the chuck bends rather than the reticle during clamping in order to maintain a secure hold on the reticle. As such, the reticle remains relatively unchanged and therefore reticle distortions associated with a bent reticle are substantially reduced. It has generally been observed that a chuck having a thickness less than about 10 mm, and more particularly between about 1 mm and about 3 mm may be used.

In accordance with yet another aspect of the invention, a mask support ring may be provided to reduce reticle distortion. The mask support ring, designated 50 in FIG. 1, is often an annular ring, which is permanently or rigidly attached to the upper surface of the reticle 14 (thereby forming a single unit). In one example, the mask support ring 50 may be glued to the upper surface of the reticle 14. An opening 52 in the ring 50 is arranged to allow the passage of the electron beam therethrough so that the ring 50 does not interfere with the reticle pattern. In general, the outer periphery of the ring 50 corresponds to the outer periphery of the reticle 14. In one example, ring dimensions of approximately 220 mm OD and approximately 185 mm ID may be used for approximately a 200 mm OD reticle. The thickness of the ring 50 is typically configured to control the amount of reticle distortion, e.g., in plane distortion and/or out of plane distortion. By way of example, for a reticle having a thickness of about 0.75 mm, the ring may have a thickness between about 0 mm to about 10 mm. It has generally been found that for a thicker ring, e.g., 10 mm, a thinner chuck, e.g., 3 mm helps to reduce distortions.

With regards to the kinematic support assembly 36, the kinematic support assembly 36 is arranged to support the chuck 34 relative to the stage table 32. More particularly, the kinematic support assembly 36 provides a non-hysteretic way of supporting the chuck 34 relative to the stage table 32. By non-hysteretic, it is meant, for example, that the kinematic support assembly 36 may be altered by an external agent while having the ability to return to its original non-altered configuration when the altering agent is removed. By way of example, the external agent may be deforming chuck such as a thermally expanding or contracting chuck or a deforming stage such as a thermally expanding or contracting stage. Accordingly, the chuck is held in manner that does not distort the chuck. That is, the chuck is free to expand or contract (radially) substantially without causing distortion, as for example, distortion created by a constrained expanding chuck. As should be appreciated, stress induced on the reticle is reduced by substantially eliminating chuck distortions. Furthermore, the kinematic support assembly 36 allows the chuck 34 and the reticle 14 to expand together, which reduces reticle bowing and reticle slippage.

To elaborate further, the kinematic support assembly 36 includes a plurality of kinematic flexures 55 that are substantially rigidly attached to both the chuck 34 and the stage table 32. The size, material, number, and position of the flexures 55 are arranged to both vertically and tangentially restrain the chuck 34 so as to effectively prevent up/down, sideways (e.g., lateral) and rotational movements of the chuck 34. In addition, the flexures 55 are arranged to allow the chuck 34 to move radially, as for example during thermal expansion or contraction of the chuck. By way of example, when the chuck 34 expands or contracts the flexures 55 bend in the radial direction. A contracting chuck 34 tends to pull the flexures 55 in an inward radial direction, and an expanding chuck 34 tends to push the flexures in an outward radial direction. Again, the kinematic support assembly 36 is typically non-hysteretic, and therefore, the flexures 55 are arranged to bend back to their original position when the thermal deformation is removed.

Described another way, the flexures 55 hold the chuck 34 in space in 6 degrees of freedom, while allowing freedom of radial expansion and contraction, so that the position of at least one point on the reticle is known relative to the stage. The concept of DOF (degrees of freedom) refers to the number of independent coordinates required to define its position. As is generally well known, a rigid body in three dimensions has six degrees of freedom. For example, 3 linear positions, e.g., represented by points along the x-axis, y-axis and z-axis, and 3 rotational positions represented by the angles θx, θy and θz, which are the rotational positions of the rigid body about the x-axis, y-axis and z-axis respectively. As such, the chuck 34, which is supported by the flexures 55, represents a rigid body which for the purpose of kinematic analysis is incapable of moving linearly in the x, y and z directions or rotationally about the x, y, and z axis.

Accordingly, the kinematic support assembly 36 is configured to hold the chuck in a fixed position relative to the stage so that the reticle is precisely located relative to the stage and more particularly the measuring system, e.g., interferometer and mirrors. As should be appreciated, the interferometer and mirrors are used to determine the position of the stage so that the circuit image can be precisely written to the wafer.

In the embodiment shown, a top portion of the flexure 55 is structurally attached to the stage table 32 and a bottom portion of the flexure 55 is structurally attached to the chuck 34. The attachment may be made in any suitable manner. By way of example, the attachment s can be made with a bolt, screw, adhesive glue and/or the like. In one implementation, titanium screws are used to attach the flexure 55 to the stage table 32. Titanium yields less of an impact on the magnetic fields of the electron beam projection lithography system than many metals due to its relatively poor electrical conductivity. In another implementation, a glue such as epoxy is used to attach the flexure 55 to the chuck 34. A spacer 57 may also be provided between the flexure 55 and the stage table 32 so as to create a clearance 59 between the flexures 55 and the stage table 32. As should be appreciated, the clearance 59 allows for flexure movement, as for example during thermal expansion of the chuck 34. The spacer 57 may or may not be coupled to the flexures 55 or the stage table 32. That is, in some embodiments, the spacer 57 may be an integral part of the flexure 55 or the stage table 32, and in other embodiments, the spacer 57 may be a free body that is disposed between the flexure 55 and stage table 32.

Furthermore, the radial compliant flexures 55 are generally positioned on an outside edge 42 of the chuck 34 and an inside edge 39 of the stage table 34 (e.g., inside the opening 38). By placing the flexures 55 on the outside edge 42 of the chuck 34, the flexures 55 can move to compensate for the radially expanding or contracting chuck 34. In addition, the flexures 55 are tangentially coupled to the outside edge 42 of the chuck 34 so as to provide DOF rigidity. As shown, the flexures 55 are typically vertical members, which are parallel to both the inside of the opening 38 and the outside edge 42 of the chuck 34. It should be appreciated, however, that this is not a limitation and the position of the flexures 55 may vary according to the specific design of each assembly.

To elaborate further, the kinematic support assembly 36 generally includes multiple, e.g., three, kinematic flexures 55 that are spaced apart along the outer periphery of the chuck 34. The three flexures 55 work together to provide both vertical and tangential rigidity while allowing the chuck 34 the ability to expand or contract. In general, it can be said that each of the three flexures 55 takes up about two degrees of freedom, however, more specifically, the vectorial combination of the flexures 55 essentially prevents the chuck 34 from moving relative to the stage table 32. As is well known in the art, three points define a plane and therefore its preferable to have three flexures 55 holding the chuck 34. Three flexures 55 tend to eliminate out of plane distortions associated with other multiple arrangements. That is, the three flexured assembly maintains a planar support structure so that the chuck 34 and more particularly the reticle 14 remain substantially planar. In most cases, each flexure 55 is spaced an equal distance apart from one another along the chuck perimeter. In some cases, however, it may be necessary to space the flexures 55 at different distances, for example, to overcome a physical limitation of the lithography system. As such, an angle 60 between any two of the flexures 55 is configured to be between about 80 and about 140 degrees. By way of example, an angle of about 120 degrees between all three flexures 55 may be used. In one implementation, the flexures 55 are separated by 90 degrees, 135 degrees and 135 degrees, respectfully. As should be appreciated, as the angle 60 is decreased between any two flexures 55, the planar and lateral support of the entire assembly decreases, i.e., the three flexures begins to perform like two flexures when the angle between them becomes small. In general, the shallower the angle 60, the more rigid and less flexible the flexures 55 have to be configured.

As mentioned, moving iron structures may alter the static magnetic fields around an electron beam lens and moving metal parts may generate eddy currents in the static magnetic fields. Therefore, in most cases, the flexures 55 are formed from a suitable non-conducting or semi-conducting material. The material is also preferably formed from a ductile material that is flexible so that the flexure 55 can bend without fracture. A flexible material allows the flexures 55 to be compliant with respect to the expanding and contracting chuck 34. In addition, the material also preferably has properties that allow it to remain rigid so as to keep the chuck 34 in a fixed position relative to the stage table 32. In one embodiment, the flexures 55 are formed from zirconia. It should be noted, however, that this is not a limitation and that the material may vary according to the specific design of each system. For example, flexures 55 formed from a ceramic such as silicon may also be used. Other materials such as metals can also be used if the electrical conductivity is low. Moreover, if the kinematic support assembly is used in systems other than electron beam projection lithography systems then the flexures 55 may be formed from conducting materials. By way of example, if the assembly is used in standard optical lithography systems then the flexures 55 may be formed from stainless steel, spring steel, berylium-copper and the like.

Moreover, the size of the flexures 55 is dependent on many factors. For one, the size of the flexure 55 generally varies according to the position, material and number of the flexures. As shown in FIG. 5 and 6, the flexures 55 are rectangular plates having a length 62, a width 64 and a thickness 66. It is generally believed that the greater the width 64, the greater the rigidity in the direction (e.g. tangential) orthogonal to the bending direction (e.g., radial). It is also generally believed that the greater the thickness 66, the greater the rigidity in the bending direction (e.g., radial).

Furthermore, it is also generally believed that the greater the length 62, the greater the flexibility (lose some stiffness). All three properties can be balanced, along with the position, material and number to produce a kinematic support assembly 36 for holding the chuck in a precise and known position relative to the stage. In one embodiment, the flexures 55 are configured with more width and less thickness to provide the desired rigidity and bending.

While this invention has been described in terms of several preferred embodiments, there are alterations, permutations, and equivalents, which fall within the scope of this invention. For example, although the present invention was described in context of an electron beam projection lithography system, it should be understood that this is not a limitation and that other systems such as optical lithography systems may be used. It should also be noted that there are many alternative ways of implementing the methods and apparatuses of the present invention. By way of example, although the above-described embodiments are well suited for reticles, the invention is not limited to use with reticles. For example, the invention may be used to hold other types of substrates such as wafers, photomasks and the like. In addition, although the flexures are shown as vertical hanging structures, they could also be positioned at different angles or be support structures that are coupled from beneath the chuck. It is therefore intended that the following appended claims be interpreted as including all such alterations, permutations, and equivalents as fall within the true spirit and scope of the present invention.

What is claimed is:

1. A lithography system for processing a substrate, comprising:
   a stage for moving the substrate relative to a beam;
   a chuck for securely holding the substrate during stage movement; and
   a support assembly for holding the chuck in a fixed position relative to the stage while accommodating for deformations in either the chuck or the stage during processing, the support assembly including a plurality of flexures that work together to both vertically and tangentially restrain the chuck.

2. The lithography system as recited in claim 1 wherein the plurality of flexures are spaced apart from one another along the outer periphery of the chuck.

3. The lithography system as recited in claim 2 wherein the flexures are symmetrically spaced along the outer periphery of the chuck.

4. The lithography system as recited in claim 2 wherein the plurality of flexures include three flexures.

5. The lithography system as recited in claim 4 wherein the flexures are spaced along the outer periphery of the chuck so as to define angles therebetween, the angles being about 90 degrees, 135 degrees and 135 degrees, respectively.

6. The lithography system as recited in claim 1 wherein the plurality of flexures are formed from zirconia.

7. The lithography system as recited in claim 1 wherein the support assembly rigidly holds the chuck in space in 6 degrees of freedom so that the position of at least one point on the reticle is known relative to the stage.

8. The lithography system as recited in claim 1 wherein the chuck is disposed in a stage opening having an inner peripheral surface that surrounds an outer peripheral surface of the chuck, and wherein the support assembly is attached to both the stage and the chuck and positioned between the inner peripheral of the stage and the outer peripheral surface of the chuck.

9. The lithography system as recited in claim 8 wherein the chuck is an annular ring having an opening for allowing the passage of a transmitted beam therethrough.

10. The lithography system as recited in claim 1 wherein the chuck is configured to expand and contract at substantially the same rate as the reticle such that the reticle and chuck expand or contract together.

11. The lithography system as recited in claim 10 wherein the chuck is formed from a material that has a substantially similar coefficient of thermal expansion to the reticle.

12. The lithography system as recited in claim 10 wherein the chuck is formed from the same material as the reticle.

13. The lithography system as recited in claim 12 wherein the reticle and the chuck are formed from silicon.

14. The system as recited in claim 8 wherein the flexures extend vertically between the chuck and the stage.

15. The lithography system as recited in claim 1 wherein the thickness of the chuck is less than about 10 mm.

16. The lithography system as recited in claim 1 wherein the chuck is an electrostatic chuck, a vacuum chuck or a mechanical chuck.

17. The lithography system as recited in claim 1 wherein a mask support ring is attached to an upper surface of the reticle so as to reduce reticle distortions.

18. The lithography system recited in claim 1 wherein the lithography system is an electron beam projection lithography system.

19. The lithography system recited in claim 1 wherein the substrate is a patterned reticle, and wherein a pattern of the patterned reticle is written on a wafer by projecting the beam through the patterned reticle.

20. A support assembly for holding a chuck in a fixed position relative to a stage while allowing some plasticity of the chuck during processing, comprising:
   a plurality of flexures, each of which has one end attached to the stage and an opposite end attached to the chuck, the plurality of flexures working together to restrain the chuck from lateral, vertical and rotational movements while allowing some expansion or contraction of the chuck relative to the stage.

21. The support assembly as recited in claim 20 wherein the flexures are configured to bend in a radial direction so as to allow the chuck to expand or contract relative to the stage.

22. The system as recited in claim 20 wherein the flexures are formed from a non conducting or semiconducting material.

23. A lithography system for processing a substrate, comprising:
   a stage for moving the substrate relative to a beam;
   a chuck for securely holding the substrate during stage movement; and
   a support assembly for holding the chuck in a fixed position relative to the stage while accommodating for deformations in either the chuck or the stage during processing, the support assembly rigidly holding the chuck in space in 6 degrees of freedom so that the position of at least one point on the reticle is known relative to the stage.

24. The lithography system as recited in claim 23 wherein the support assembly includes a plurality of flexures, the plurality of flexures working together to both vertically and tangentially restrain the chuck.

25. The lithography system as recited in claim 23 wherein the plurality of flexures are spaced apart from one another along the outer periphery of the chuck.

26. The lithography system as recited in claim 25 wherein the flexures are symmetrically spaced along the outer periphery of the chuck.

27. The lithography system as recited in claim 23 wherein the plurality of flexures include three flexures.

28. The lithography system as recited in claim 23 wherein the chuck is disposed in a stage opening having an inner peripheral surface that surrounds an outer peripheral surface of the chuck, and wherein the support assembly is attached to both the stage and the chuck and positioned between the inner peripheral of the stage and the outer peripheral surface of the chuck.

29. The lithography system as recited in claim 28 wherein the chuck is an annular ring having an opening for allowing the passage of a transmitted beam therethrough.

30. The lithography system as recited in claim 23 wherein the chuck is configured to expand and contract at substantially the same rate as the reticle such that the reticle and chuck expand or contract together.

31. The lithography system as recited in claim 30 wherein the chuck is formed from a material that has a substantially similar coefficient of thermal expansion to the reticle.

32. The lithography system as recited in claim 30 wherein the chuck is formed from the same material as the reticle.

33. The lithography system as recited in claim 23 wherein the chuck is an electrostatic chuck, a vacuum chuck or a mechanical chuck.

34. The lithography system as recited in claim 23 wherein a mask support ring is attached to an upper surface of the reticle so as to reduce reticle distortions.

35. The lithography system recited in claim 23 wherein the lithography system is an electron beam projection lithography system.

* * * * *